US012633724B2

(12) United States Patent
Hara et al.

(10) Patent No.: US 12,633,724 B2
(45) Date of Patent: May 19, 2026

(54) VARIABLE-WAVELENGTH SURFACE EMISSION LASER

(71) Applicant: National Institute of Information and Communications Technology, Tokyo (JP)

(72) Inventors: Motoaki Hara, Tokyo (JP); Yuichiro Yano, Tokyo (JP); Masatoshi Kajita, Tokyo (JP); Tetsuya Ido, Tokyo (JP); Satoshi Shinada, Tokyo (JP); Takahito Ono, Miyagi (JP); Masaya Toda, Miyagi (JP)

(73) Assignee: National Institute of Information and Communications Technology, Tokyo (JP)

( * ) Notice: Subject to any disclaimer, the term of this patent is extended or adjusted under 35 U.S.C. 154(b) by 975 days.

(21) Appl. No.: 17/783,776

(22) PCT Filed: Dec. 8, 2020

(86) PCT No.: PCT/JP2020/045561
§ 371 (c)(1),
(2) Date: Jun. 9, 2022

(87) PCT Pub. No.: WO2021/117696
PCT Pub. Date: Jun. 17, 2021

(65) Prior Publication Data
US 2023/0012453 A1     Jan. 12, 2023

(30) Foreign Application Priority Data

Dec. 13, 2019     (JP) ................................. 2019-225090

(51) Int. Cl.
*H01S 5/183*     (2006.01)
*H01S 5/042*     (2006.01)

(52) U.S. Cl.
CPC ...... *H01S 5/18363* (2013.01); *H01S 5/04254* (2019.08); *H01S 5/04256* (2019.08)

(58) Field of Classification Search
CPC .... H01S 5/042; H01S 5/18363; H01S 5/0234; H01S 5/183
See application file for complete search history.

(56) References Cited

U.S. PATENT DOCUMENTS

2003/0002146 A1*  1/2003  Shimizu .............. H01S 5/04254
                                                    359/344
2008/0279241 A1*  11/2008  Oki ......................... H01S 5/221
                                                    372/45.01
(Continued)

FOREIGN PATENT DOCUMENTS

CN          1509406 A  *  6/2004  ............. B82Y 20/00
CN        109842017 A       6/2019
(Continued)

OTHER PUBLICATIONS

Translation of description of JP 2015106607 A (Year: 2015).*

(Continued)

*Primary Examiner* — Xinning Niu
*Assistant Examiner* — Hunter Jared Nelson
(74) *Attorney, Agent, or Firm* — GRUMBLES LAW PLLC; Brittany Haanan

(57) ABSTRACT

Provided is a variable-wavelength surface emission laser having a wide wavelength variation range. A partial region of a thin-plate substrate (22) and a movable mirror (20), the partial region being positioned between an air gap (G1) and a movable gap (G2), can move toward the air gap (G1) side or the movable gap (G2) side.

4 Claims, 6 Drawing Sheets

(56)           References Cited

U.S. PATENT DOCUMENTS

| | | | |
|---|---|---|---|
| 2011/0182318 A1* | 7/2011 | Ikuta .................. | H01S 5/18327 |
| | | | 372/50.1 |
| 2015/0010031 A1 | 1/2015 | Makino et al. | |
| 2015/0049341 A1* | 2/2015 | Fujii .................. | H01S 5/06216 |
| | | | 356/479 |
| 2018/0131156 A1* | 5/2018 | Yanagase ............. | G02B 6/4202 |
| 2019/0044304 A1* | 2/2019 | Jayaraman .............. | H01S 5/041 |

FOREIGN PATENT DOCUMENTS

| | | | | | |
|---|---|---|---|---|---|
| JP | 2004281733 A | | 10/2004 | | |
| JP | 2005223111 A | | 8/2005 | | |
| JP | 4200431 B2 | | 12/2008 | | |
| JP | 2009170736 A | | 7/2009 | | |
| JP | 2015106607 A | * | 6/2015 | ......... | G01B 9/02004 |
| JP | 2016523444 A | | 8/2016 | | |

OTHER PUBLICATIONS

Definition of "On" from Merriam-Webster (Year: 2025).*
CN-1509406-A Description Translation (Year: 2004).*
Huang et al., "Monolithic Integrated Piezoelectric MEMS-Tunable VCSEL", IEEE Journal of Selected Topics in Quantum Electronics, 2007, 13:2, 374-380.
International Search Report and Written Opinion pertaining to PCT/JP2020/045561, mailed Mar. 9, 2021.

* cited by examiner

VARIABLE-WAVELENGTH SURFACE EMISSION LASER

BACKGROUND OF THE INVENTION

Field of the Invention

The present invention relates to a variable-wavelength surface emission laser.

Description of the Related Art

As for a vertical cavity surface emitting laser (VCSEL), the wavelength variation technology is roughly classified into two types: one using thermal control and the other adding a movable mirror. In the former method using thermal control, the temperature characteristics of the constituent materials of the VCSEL are utilized, the injection current for laser oscillation is increased or decreased, and the wavelength is changed by Joule heat. In this thermal control method, it is necessary to add a cooling mechanism or preheat so that natural cooling can be effectively utilized in order to control the wavelength. In the thermal control method, its wavelength variation range may be limited when operating a VCSEL in a constant temperature environment as in an atomic clock system.

In the latter method of adding a movable mirror, the wavelength can be controlled without using heat by mechanically driving a reflection film (Patent Literature 1 and Non-Patent Literature 1). In the method described in Patent Literature 1, wavelength control is realized by attaching a movable mirror that is movable (moves) by electrostatic attractive force to a half VCSEL composed of one multilayer Bragg reflection film and an active layer.

In a VCSEL 9 described in Non-Patent Literature 1, as shown in FIG. 6, a multilayer Bragg reflection film 92 is separated from an active layer 102, and the multilayer Bragg reflection film 92 is made movable in an optical axis direction by electrostatic attractive force, thus realizing wavelength control. Note that FIG. 6 shows movable mirror driving terminals 90 and 94, insulating layers 91 and 95, a sacrificial layer 93, low refractive index compound semiconductors 96, 98, and 100, a high refractive index compound semiconductor 97, a multi-quantum well (MQW) 99, an optical confinement layer 101, a multilayer Bragg reflection film 103, a compound substrate 104, and a current injection terminal 105. The low refractive index compound semiconductors 98 and 100 and the MQW 99 form the active layer 102.

CITATION LIST

Patent Literature

Patent Literature 1: JP4200431

Non-Patent Literature

Non-Patent Literature 1: M. C. Y. Huang et. al., "Monolithic Integrated Piezoelectric MEMS-Tunable VCSEL", IEEE Journal of Selected Topics in Quantum Electronics, Vol. 13(2), pp. 374-380, 2007

SUMMARY OF INVENTION

In the conventional method described above, since the reflection film can be moved only in one direction, there is a problem that the wavelength variation range is narrow.

Therefore, it is an object of the present invention to provide a variable-wavelength surface emission laser having a wide wavelength variation range.

A variable-wavelength surface emission laser according to the present invention to achieve the object includes: a first substrate; a thin-plate substrate provided so as to face the first substrate via an air gap; and a second substrate provided so as to face the thin-plate substrate via a movable gap, in which the first substrate includes a first reflection layer formed on one plane of the first substrate, an active layer formed on the first reflection layer, and a first movable electrode formed on the active layer with an insulating layer interposed therebetween, the thin-plate substrate includes a second reflection layer formed on a plane facing the active layer, the second substrate includes a second movable electrode formed on a plane opposite to the movable gap, and the thin-plate substrate and the second reflection layer have a partial region movable toward the air gap side and the movable gap side, the partial region being positioned between the air gap and the movable gap.

According to this configuration, when a voltage is applied to the first movable electrode, electrostatic attractive force toward the air gap side is generated, and when a voltage is applied to the second movable electrode, electrostatic force toward the movable gap side is generated. These attractive forces cause the second reflection layer to be movable in both directions. Thus, according to the variable-wavelength surface emission laser, the second reflection layer is movable toward both the air gap side and the movable gap side, and thus the wavelength variation range can be widened.

According to the present invention, the wavelength variation range can be widened.

DETAILED DESCRIPTION OF EMBODIMENTS

Figure 1:
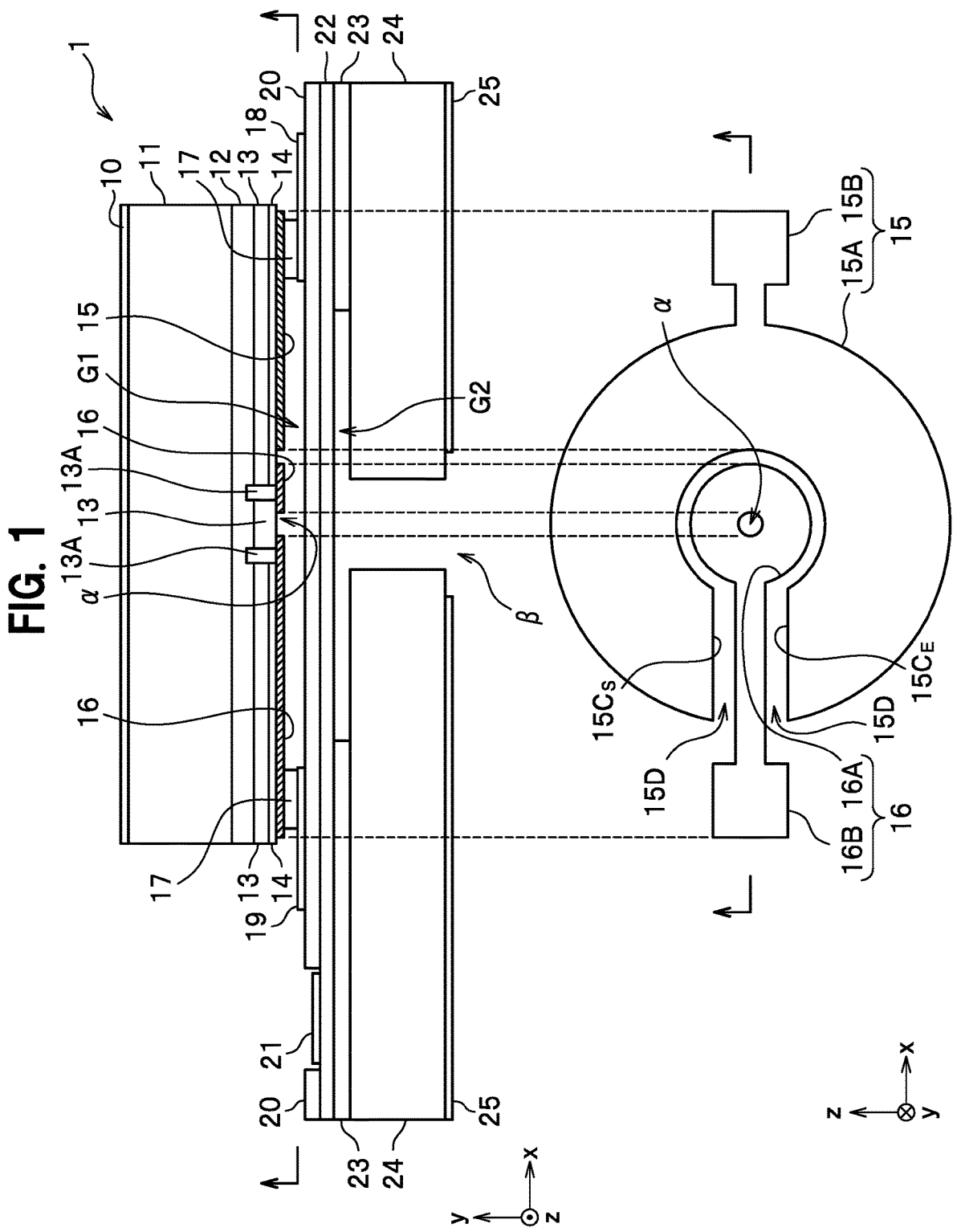
FIG. 1 shows a cross-sectional view of a variable-wavelength surface emission laser and a front view of an upper movable electrode according to a first embodiment.

Hereinafter, embodiments of the present invention will be described with reference to the drawings. However, the embodiments described below are for embodying the technical idea of the present invention, and the present invention is not limited to the following unless otherwise specified. In addition, the size and positional relationships of the members shown in the drawings may be exaggerated in order to clarify the explanation. In the embodiments, the same components may be denoted by the same reference numerals, and description thereof may be omitted.

First Embodiment

[Configuration of Variable-Wavelength Surface Emission Laser]

With reference to FIG. 1, a configuration of a variable-wavelength surface emission laser 1 according to a first embodiment will be described.

As shown in FIG. 1, it is assumed that a horizontal direction is an x-axis, a vertical direction is a y-axis, and a depth direction is a z-axis.

As shown in FIG. 1, the variable-wavelength surface emission laser 1 is a variable-wavelength VCSEL that emits laser light downward, and includes an upper substrate (first substrate) 11, a thin-plate substrate 22 provided so as to face the upper substrate 11 via an air gap G1, and a lower substrate (second substrate) 24 provided so as to face the thin-plate substrate 22 via a movable gap G2. To be more specific, the variable-wavelength surface emission laser 1 includes an anode-side light emitting electrode (first light emitting electrode) 10, the upper substrate 11, a DBR layer 12, an active layer 13, an insulating layer 14, an upper movable electrode 15, a cathode-side light emitting electrode (second light emitting electrode) 16, an air gap former 17, a movable electrode terminal 18, a light emitting electrode terminal 19, a movable mirror 20, a reference potential terminal 21, the thin-plate substrate 22, a movable gap former 23, the lower substrate 24, and a lower movable electrode (second movable electrode) 25.

The anode-side light emitting electrode 10 is an electrode (positive electrode) to which a voltage for causing the variable-wavelength surface emission laser 1 to emit light is applied. The anode-side light emitting electrode 10 is formed on the other plane (upper plane) of the upper substrate 11. Examples of the anode-side light emitting electrode 10 may include an aluminum electrode and a copper electrode.

The upper substrate 11 is a substrate having the anode-side light emitting electrode 10 formed on its upper plane and the DBR layer 12 formed on its lower plane. Examples of the upper substrate 11 may include an n-type indium phosphide (InP) substrate.

The DBR layer 12 is a distributed Bragg reflector layer formed on one plane of the upper substrate 11. For example, the DBR layer 12 is formed on a plane (lower plane) opposite to the anode-side light emitting electrode 10 on the upper substrate 11. Examples of the DBR layer 12 may include an n-type indium gallium arsenide (InP/InGaAs) multilayer film and a gallium arsenide (GaAs)/aluminum arsenide (AlAs) multilayer film.

The active layer 13 is an active layer formed on the DBR layer 12. For example, the active layer 13 is formed on a plane (lower plane) of the DBR layer 12 opposite to the upper substrate 11. Examples of the active layer 13 may include a multi-quantum well (MQW) active layer.

The insulating layer 14 is an insulating layer formed on a plane (lower plane) of the active layer 13 opposite to the DBR layer 12. The insulating layer 14 is not formed in a range overlapping a light emitting region α of the variable-wavelength surface emission laser 1. Examples of the insulating layer 14 may include an aluminum oxide film. Here, an optical confinement member 13A is formed near the center of the active layer 13 and the insulating layer 14, and a central portion of the active layer 13 is exposed from the insulating layer 14. The optical confinement member 13A confines photoelectrons in the light emitting region α, and is, for example, an annular member formed of SiO2.

The light emitting region α is a region where the variable-wavelength surface emission laser 1 generates (emits) laser light, and is located substantially at the center in the horizontal direction and the depth direction, for example.

The upper movable electrode 15 is an electrode for moving the movable mirror 20 toward the air gap G1 (upward). That is, the upper movable electrode 15 is an electrode added to the half VCSEL side (upper substrate 11 side) so as not to come into contact with the cathode-side light emitting electrode 16. Here, the upper movable electrode 15 is formed on the active layer 13 with the insulating layer 14 interposed therebetween. To be more specific, the upper movable electrode 15 is formed on a plane (lower plane) of the insulating layer 14 opposite to the active layer 13. Examples of the upper movable electrode 15 may include an aluminum electrode and a copper electrode.

The cathode-side light emitting electrode 16 is an electrode for causing the variable-wavelength surface emission laser 1 to emit light, and is an electrode (negative electrode) paired with the anode-side light emitting electrode 10. The cathode-side light emitting electrode 16 is formed on the same plane of the active layer 13 as the upper movable electrode 15 (for example, the lower plane of the insulating layer 14). Examples of the cathode-side light emitting electrode 16 may include an aluminum electrode and a copper electrode.

<Details of Upper Movable Electrode and Cathode-Side Light Emitting Electrode>

The upper movable electrode 15 and the cathode-side light emitting electrode 16 will be described in detail below.

The upper movable electrode 15 and the cathode-side light emitting electrode 16 are formed at the same height in the vertical direction and on the same plane in the horizontal direction and the depth direction so as not to come into contact with each other.

The upper movable electrode 15 has an arc-shaped movable electrode main body part 15A and a movable electrode extension part 15B in plan view.

The movable electrode main body part 15A is arranged so as to surround the light emitting region α with the light emitting region α as the center. The movable electrode main body part 15A is provided with a space 15D so as not to connect one end point 15Cs and the other end point 15CE. That is, the movable electrode main body part 15A has a predetermined width in a circumferential direction, and since the space 15D is provided in a leftward direction, the movable electrode main body part 15A is formed in an inverted C-shape.

The movable electrode extension part 15B is extended in the circumferential direction (rightward direction) from the movable electrode main body part 15A. The movable electrode extension part 15B has a square-shaped end portion, and an air gap former 17 is formed on a lower surface of the end portion.

The cathode-side light emitting electrode 16 has a circular light emitting electrode main body part 16A and a light emitting electrode extension part 16B in plan view.

The light emitting electrode main body part 16A is formed between the movable electrode main body part 15A and the light emitting region α. That is, the light emitting electrode main body part 16A is located on the inner peripheral side of the movable electrode main body part 15A so as to be surrounded by the movable electrode main body part 15A. The light emitting electrode main body part 16A is not formed in a range overlapping the light emitting region α.

The light emitting electrode extension part 16B is extended in the circumferential direction (leftward direction) from the light emitting electrode main body part 16A so as to pass through the space 15D provided in the movable electrode main body part 15A. The light emitting electrode extension part 16B has a square-shaped end portion, and the air gap former 17 is formed on a lower surface of the end portion.

Referring back to the upper part of FIG. 1, the description of the variable-wavelength surface emission laser 1 will be continued.

The air gap former 17 forms the air gap G1 between the active layer 13 and the movable mirror 20, and is provided between the movable electrode extension part 15B and the movable electrode terminal 18. FIG. 1 shows two air gap formers 17. Examples of the air gap former 17 may include solder.

The movable electrode terminal 18 is a terminal of the upper movable electrode 15 formed on the upper plane of the movable mirror 20. That is, the movable electrode terminal 18 is electrically connected to the movable electrode extension part 15B via the air gap former 17. Examples of the movable electrode terminal 18 may include an aluminum electrode and a copper electrode.

The light emitting electrode terminal 19 is a terminal of the cathode-side light emitting electrode 16 formed on the upper plane of the movable mirror 20. That is, the light emitting electrode terminal 19 is electrically connected to the light emitting electrode extension part 16B via the air gap former 17. Examples of the light emitting electrode terminal 19 may include an aluminum electrode and a copper electrode.

The movable mirror 20 is a reflection layer formed on a plane (upper plane) of the thin-plate substrate 22 facing the active layer 13. That is, the movable mirror 20 is provided on the thin-plate substrate 22 so as to face the active layer 13 via the air gap G1. The movable mirror 20 is movable toward the air gap G1 side (upward) and toward the movable gap G2 side (downward) together with a partial region of the thin-plate substrate 22 to be described later. The movable mirror 20 has a recess for arranging the reference potential terminal 21. The movable mirror 20 is the same distributed Bragg reflector layer (DBR layer) as the DBR layer 12.

The movable gap G2 is a space for moving the movable mirror 20 in a direction opposite to the air gap G1 (downward).

The reference potential terminal 21 is a terminal that serves as a reference potential (GND) with respect to the anode-side light emitting electrode 10, the upper movable electrode 15, and the lower movable electrode 25. Examples of the reference potential terminal 21 may include an aluminum electrode and a copper electrode.

The thin-plate substrate 22 is a substrate provided so as to face the upper substrate 11 via the air gap G1. The thin-plate substrate 22 has the movable mirror 20 formed on its plane (upper plane) on the air gap G1 side, and has a movable gap former 23 formed on its plane (lower plane) on the movable gap G2 side. The thin-plate substrate 22 has a partial region movable toward the air gap G1 side (upward) and the movable gap G2 side (downward), the partial region being located between the air gap G1 and the movable gap G2. Examples of the thin-plate substrate 22 may include a Si substrate having a film thickness of about 1 micron.

The movable mirror 20 and the thin-plate substrate 22 may be movable in the vertical direction in a range of at least 500 nanometers, and other regions may be movable in the vertical direction.

The movable gap former 23 forms the movable gap G2 between the thin-plate substrate 22 and the lower substrate

24, and is provided between the thin-plate substrate 22 and the lower substrate 24. FIG. 1 shows two movable gap formers 23. Examples of the movable gap former 23 may include a formation layer formed of SiO2.

The lower substrate 24 is a substrate provided so as to face the thin-plate substrate 22 via the movable gap G2. The lower substrate 24 has a laser light exit hole β provided at its center. Although FIG. 1 shows two lower substrates 24, the lower substrate 24 is a single substrate in plan view that has the exit hole β formed at its center. The lower substrate 24 has the movable gap formers 23 formed on the left and right sides of its upper plane, and has lower movable electrodes 25 formed on the left and right sides of its lower plane. Examples of the lower substrate 24 may include an n-type Si substrate.

The lower movable electrode 25 is an electrode for moving the movable mirror 20 toward the movable gap G2 side (downward). The lower movable electrode 25 is formed on a plane (lower plane) of the lower substrate 24 opposite to the movable gap G2. Examples of the lower movable electrode 25 may include an aluminum electrode and a copper electrode.

<Laser Light Emission>

Hereinafter, detailed description is given of an operation of the variable-wavelength surface emission laser 1 to emit laser light.

A case is considered where a voltage is applied between the anode-side light emitting electrode 10 and the cathode-side light emitting electrode 16 (light emitting electrode terminal 19). In this case, in the variable-wavelength surface emission laser 1, a current (holes) flows from the anode-side light emitting electrode 10 to the cathode-side light emitting electrode 16 through the upper substrate 11, the DBR layer 12, and the active layer 13 in the light emitting region α in which the insulating layer 14 is not formed. On the other hand, in the variable-wavelength surface emission laser 1, electrons flow from the cathode-side light emitting electrode 16 to the anode-side light emitting electrode 10 in the light emitting region α.

In the variable-wavelength surface emission laser 1, the light is generated in the light emitting region α by the combination of holes and electrons. Then, the light is amplified by an optical resonator formed between the DBR layer 12 and the movable mirror 20, and emitted as laser light. In this event, the wavelength of the laser light emitted by the variable-wavelength surface emission laser 1 depends on the width of the air gap G1. Therefore, in the variable-wavelength surface emission laser 1, the wavelength of the laser light can be controlled by changing the width of the air gap G1.

<Laser Light Wavelength Control>

With reference to FIG. 2, detailed description is given of an operation of the variable-wavelength surface emission laser 1 to control the wavelength of the laser light.

Figure 2A:
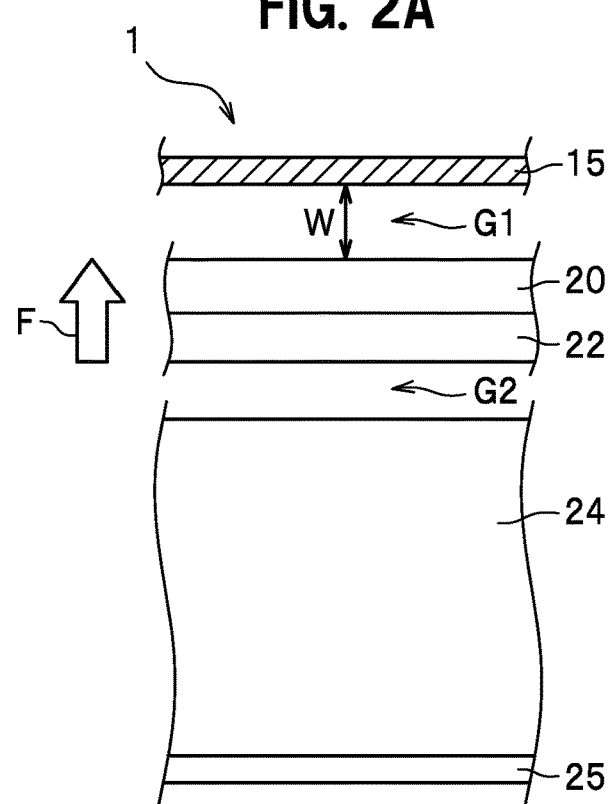
FIG. 2A is an explanatory view when a movable mirror is movable toward an air gap side.

As shown in FIG. 2A, a case is considered where a voltage is applied between the upper movable electrode 15 and the reference potential terminal 21 (FIG. 1). In this case, in the variable-wavelength surface emission laser 1, electrostatic attractive force F is generated between the thin-plate substrate 22 and the movable mirror 20 and the upper movable electrode 15, and the thin-plate substrate 22 and the movable mirror 20 can move toward the air gap G1 side (upward). As a result, in the variable-wavelength surface emission laser 1, the width W of the air gap G1 is reduced.

Figure 2B:
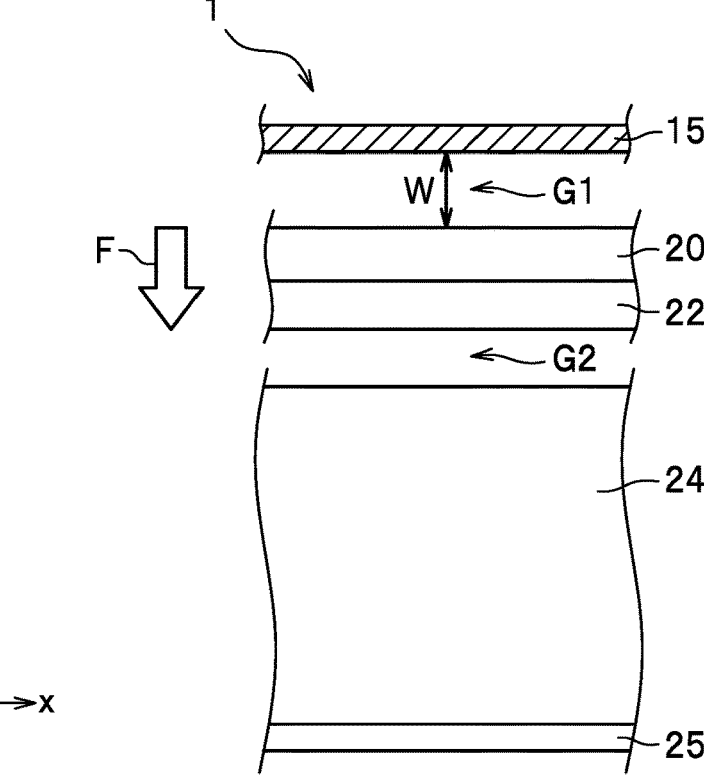
FIG. 2B is an explanatory view when the movable mirror is movable toward a movable gap side.

As shown in FIG. 2B, a case is considered where a voltage is applied between the lower movable electrode 25 and the reference potential terminal 21. In this case, in the variable-wavelength surface emission laser 1, electrostatic attractive force F is generated between the thin-plate substrate 22 and the movable mirror 20 and the lower movable electrode 25, and the thin-plate substrate 22 and the movable mirror 20 can move toward the movable gap G2 side (downward). As a result, in the variable-wavelength surface emission laser 1, the width W of the air gap G1 is increased.

Thus, in the variable-wavelength surface emission laser 1, the wavelength of the laser light can be controlled by increasing or decreasing the width W of the air gap G1.

[Method for Manufacturing Upper Movable Electrode and Cathode-Side Light Emitting Electrode]

The variable-wavelength surface emission laser 1 can be manufactured by a general method such as photolithography or etching. For example, the DBR layer 12 and the active layer 13 can be laminated by metal organic chemical vapor deposition (MOCVD). The materials of the upper movable electrode 15 and the cathode-side light emitting electrode 16 are formed into a film by a sputtering method, and then the film is masked with a pattern showing the upper movable electrode 15 and the cathode-side light emitting electrode 16. By etching the masked laminated film, the upper movable electrode 15 and the cathode-side light emitting electrode 16 can be formed.

[Advantageous Effect]

As described above, in the variable-wavelength surface emission laser 1, the movable mirror 20 can be moved in a direction of approaching the active layer 13 and in a direction of getting away from the active layer 13. Thus, the wavelength of the laser light can be controlled positively or negatively. That is, in the variable-wavelength surface emission laser 1, the movable mirror 20 can be moved both toward the air gap G1 side and the movable gap G2 side. Thus, the width of the air gap G1 can be increased or decreased to widen the wavelength variation range.

Here, since the VCSEL is a chip component manufactured by a wafer process, the oscillation wavelength varies within a wafer surface, and allowable oscillation wavelength variation differs depending on the application. For example, in the case of a face recognition light mounted on a smartphone, variation in oscillation wavelength is allowed up to ± several tens of nm. On the other hand, in the case of an atomic clock system application, the allowable range of oscillation wavelength variation is limited to ± several nm, and the yield due to component selection is reduced, leading to increased manufacturing cost. Therefore, according to the variable-wavelength surface emission laser 1, since the wavelength variation range is wide, it becomes easy to match the center value of the variation in oscillation wavelength with a set value, and the manufacturing cost can be reduced.

The variable-wavelength surface emission laser 1 is not the one using thermal control, and thus can be easily applied to an atomic clock system that needs to be operated in a constant temperature environment.

Since the upper movable electrode 15 and the movable mirror 20 in the variable-wavelength surface emission laser 1 can be manufactured in different steps, various kinds of refinement can be added to the upper movable electrode 15.

Second Embodiment

[Configuration of Variable-Wavelength Surface Emission Laser]

Figure 3:
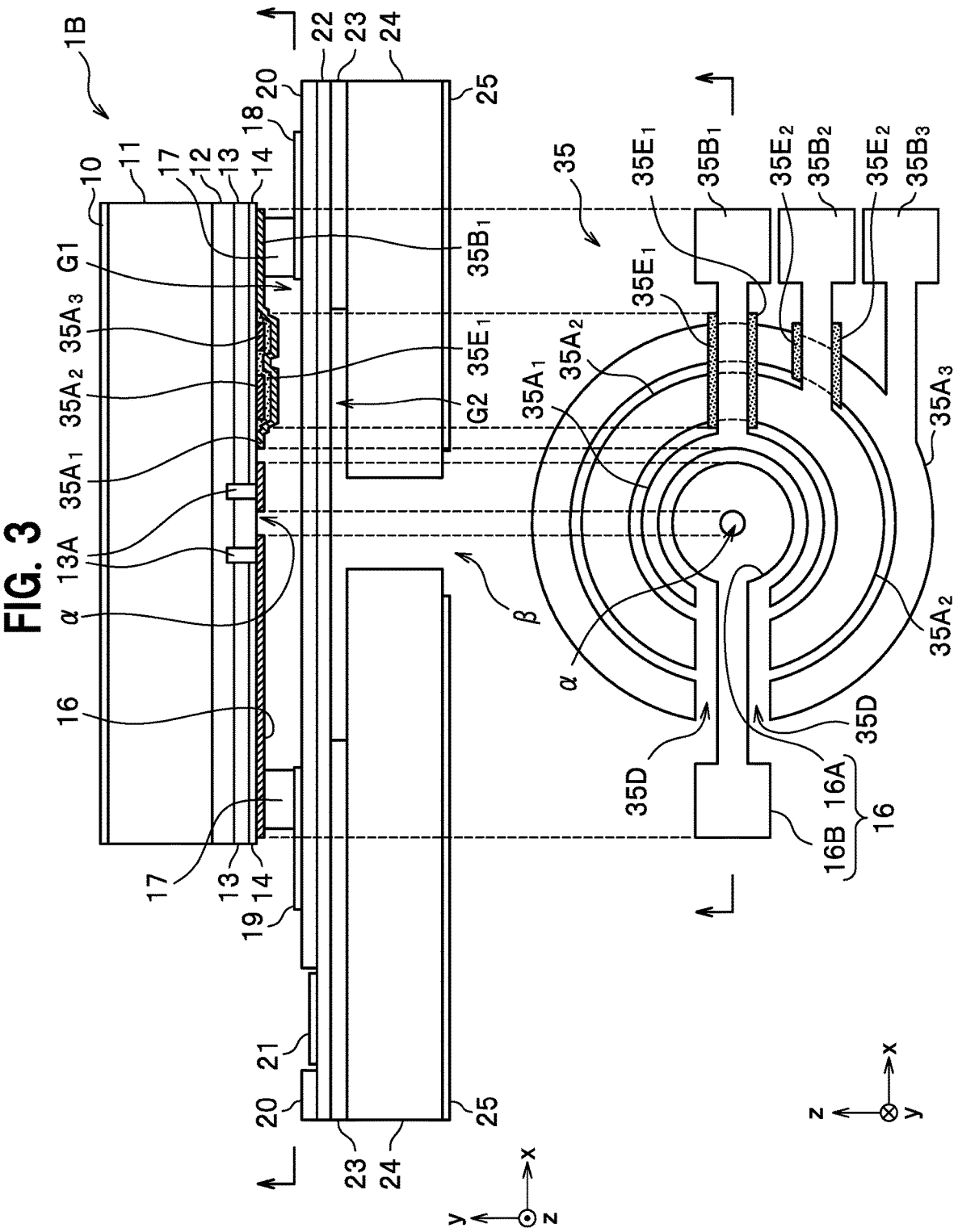
FIG. 3 shows a cross-sectional view of a variable-wavelength surface emission laser and a front view of an upper movable electrode according to a second embodiment.

With reference to FIG. 3, description is given of differences in configuration between a variable-wavelength surface emission laser 1B according to a second embodiment and that of the first embodiment.

In the variable-wavelength surface emission laser 1B, an upper movable electrode 35 is divided into a plurality of parts in order to average the deflection of a movable mirror 20.

As shown in FIG. 3, the variable-wavelength surface emission laser 1B includes the upper movable electrode 35 instead of the upper movable electrode 15 in FIG. 1.

Since the configuration other than the upper movable electrode 35 is the same as that of the first embodiment, description thereof will be omitted.

The upper movable electrode 35 is provided with a plurality of pairs of movable electrode main body parts 35A and movable electrode extension parts 35B. In this embodiment, three pairs of movable electrode main body parts $35A_1$ to $35A_3$ and movable electrode extension parts $35B_1$ to $35B_3$ are provided in order from the inner peripheral side to the outer peripheral side.

Two or four or more pairs of the movable electrode main body parts 35A and movable electrode extension parts 35B may be provided.

Three layers of the movable electrode main body parts $35A_1$ to $35A_3$ are formed concentrically around a light emitting region α. A gap 35D is provided on the same axis across all the movable electrode main body parts $35A_1$ to $35A_3$ so as not to connect both end points of the movable electrode main body parts $35A_1$ to $35A_3$. For example, the gap 35D is provided in the circumferential direction (leftward direction) from the light emitting region α.

The movable electrode extension parts $35B_1$ to $35B_3$ are extended in the circumferential direction (rightward direction) from the movable electrode main body parts $35A_1$ to $35A_3$ at different positions in the depth direction so as not to come into contact with each other. The movable electrode extension parts $35B_1$ to $35B_3$ each have a square-shaped end portion, and an air gap former 17 is formed on the lower surface of the end portion. Here, the movable electrode extension part $35B_1$ provided on the movable electrode main body part $35A_1$ on the inner peripheral side is formed so as to straddle the movable electrode main body parts $35A_2$ and $35A_3$ on the outer peripheral side via an insulating film $35E_1$. Thus, electrical contact between the movable electrode extension part $35B_1$ and the movable electrode main body parts $35A_2$ and $35A_3$ is avoided. As in the case of the movable electrode extension part $35B_1$, the movable electrode extension part $35B_2$ on the inner peripheral side is formed on the surface of the movable electrode main body part $35A_3$ on the outer peripheral side via an insulating film $35E_2$.

The light emitting electrode main body part 16A is formed between the movable electrode main body part $35A_1$ on the innermost peripheral side and the light emitting region α. That is, the light emitting electrode main body part 16A is arranged on the inner peripheral side of the movable electrode main body part $35A_1$ so as to be surrounded by the movable electrode main body part $35A_1$.

The light emitting electrode extension part 16B is extended in the circumferential direction (leftward direction) from the light emitting electrode main body part 16A so as to pass through the gaps 35D provided in the three layers of movable electrode main body parts $35A_1$ to $35A_3$. The light emitting electrode extension part 16B has a square-shaped end portion, and an air gap former 17 is formed on the lower surface of the end portion.

[Advantageous Effect]

As described above, the upper movable electrode 35 has the configuration in which three pairs of the movable electrode main body parts $35A_1$ to $35A_3$ and movable electrode extension parts $35B_1$ to $35B_3$ do not come into contact with each other. Thus, different voltages can be applied to the movable electrode main body parts $35A_1$ to $35A_3$. The shorter the distance between the movable mirror 20 and the upper movable electrode 35, the stronger the electrostatic attractive force. Thus, when the movable mirror 20 is moved, the deflection is larger on the inner peripheral side than on the outer peripheral side of the movable mirror 20. Therefore, in order to uniformly move (deflect) the movable mirror 20, the voltages applied to the movable electrode main body parts $35A_1$ to $35A_3$ may be increased from the inner peripheral side to the outer peripheral side. For example, the voltage applied to the movable electrode main body part $35A_1$ on the inner peripheral side is set low, the voltage applied to the movable electrode main body part $35A_3$ on the outer peripheral side is set high, and the voltage applied to the movable electrode main body part $35A_2$ in the middle is set between the both. Thus, the variable-wavelength surface emission laser 1B can average the deflection of the movable mirror 20.

Needless to say, the variable-wavelength surface emission laser 1B according to the second embodiment has the same effect as that of the first embodiment.

Third Embodiment

[Configuration of Variable-Wavelength Surface Emission Laser]

Figure 4:
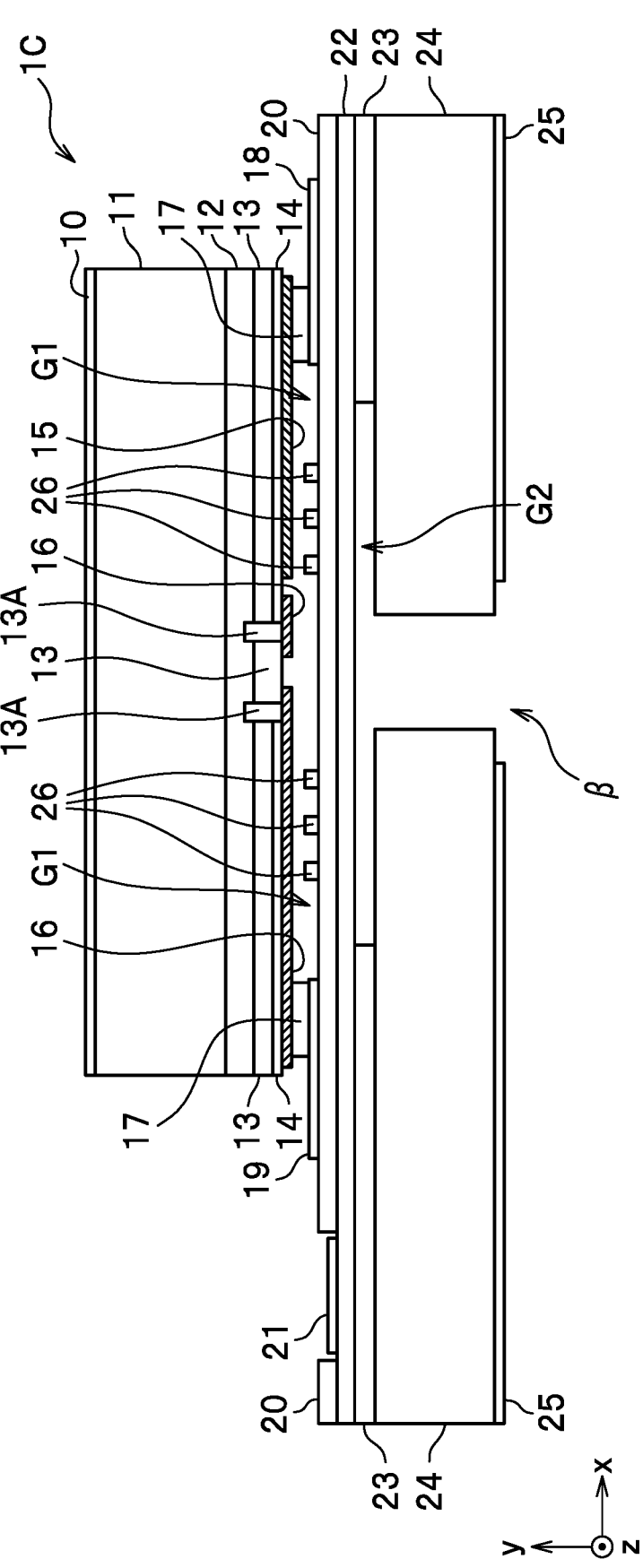
FIG. 4 is a cross-sectional view of a variable-wavelength surface emission laser according to a third embodiment.

With reference to FIG. 4, description is given of differences in configuration between a variable-wavelength surface emission laser 1C according to a third embodiment and that of the first embodiment.

As shown in FIG. 4, the variable-wavelength surface emission laser 1C includes a movable mirror 20C provided with convex parts 26.

Since the configuration other than the movable mirror 20C is the same as that of the first embodiment, description thereof will be omitted.

The movable mirror 20C has the convex parts 26 formed on a plane on the side where an air gap G1 is located. More specifically, the convex parts 26 are minute protrusions provided on the upper plane of the movable mirror 20C. For example, a total of six convex parts 26 are formed, three on each side so as not to overlap the light emitting region α.

The number and position of the convex parts 26 are not particularly limited. The shape of the convex parts 26 is also not limited, and may be a trapezoidal shape or a triangular shape as well as a rectangular shape.

The convex parts 26 can be manufactured by a general method such as photolithography or etching. For example, an SiO2 film, which is the material of the convex parts 26, is formed by a CVD method. Next, the film is masked with a pattern showing the convex parts 26. Then, by etching the masked laminated film, the convex parts 26 can be formed.
[Advantageous Effect]

As described above, in the variable-wavelength surface emission laser 1C, the convex parts 26 are provided on the upper plane of the movable mirror 20C. Thus, when the movable mirror 20C is moved upward, damage due to sticking between the movable mirror 20C and the upper movable electrode 15 and the cathode-side light emitting electrode 16 can be suppressed.

Needless to say, the variable-wavelength surface emission laser 1C according to the third embodiment has the same effect as that of the first embodiment.

The convex parts 26 may also be provided on the lower plane of the upper movable electrode 15 and the cathode-side light emitting electrode 16 instead of on the upper plane of the movable mirror 20C.

The convex parts 26 can also be applied in the second embodiment.

Fourth Embodiment

[Configuration of Variable-Wavelength Surface Emission Laser]

Figure 5:
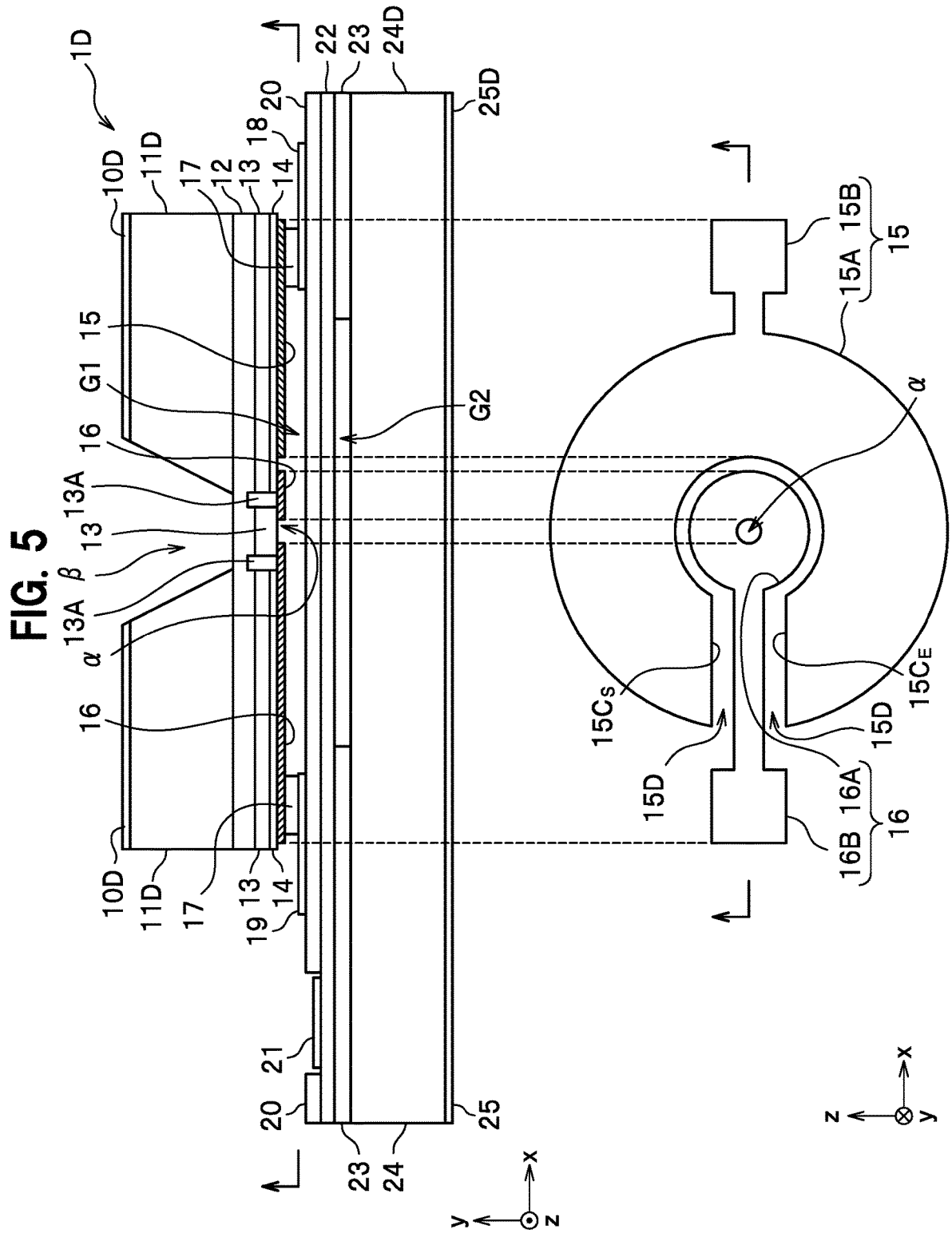
FIG. 5 shows a cross-sectional view of a variable-wavelength surface emission laser and a front view of an upper movable electrode according to a fourth embodiment.
Figure 6:
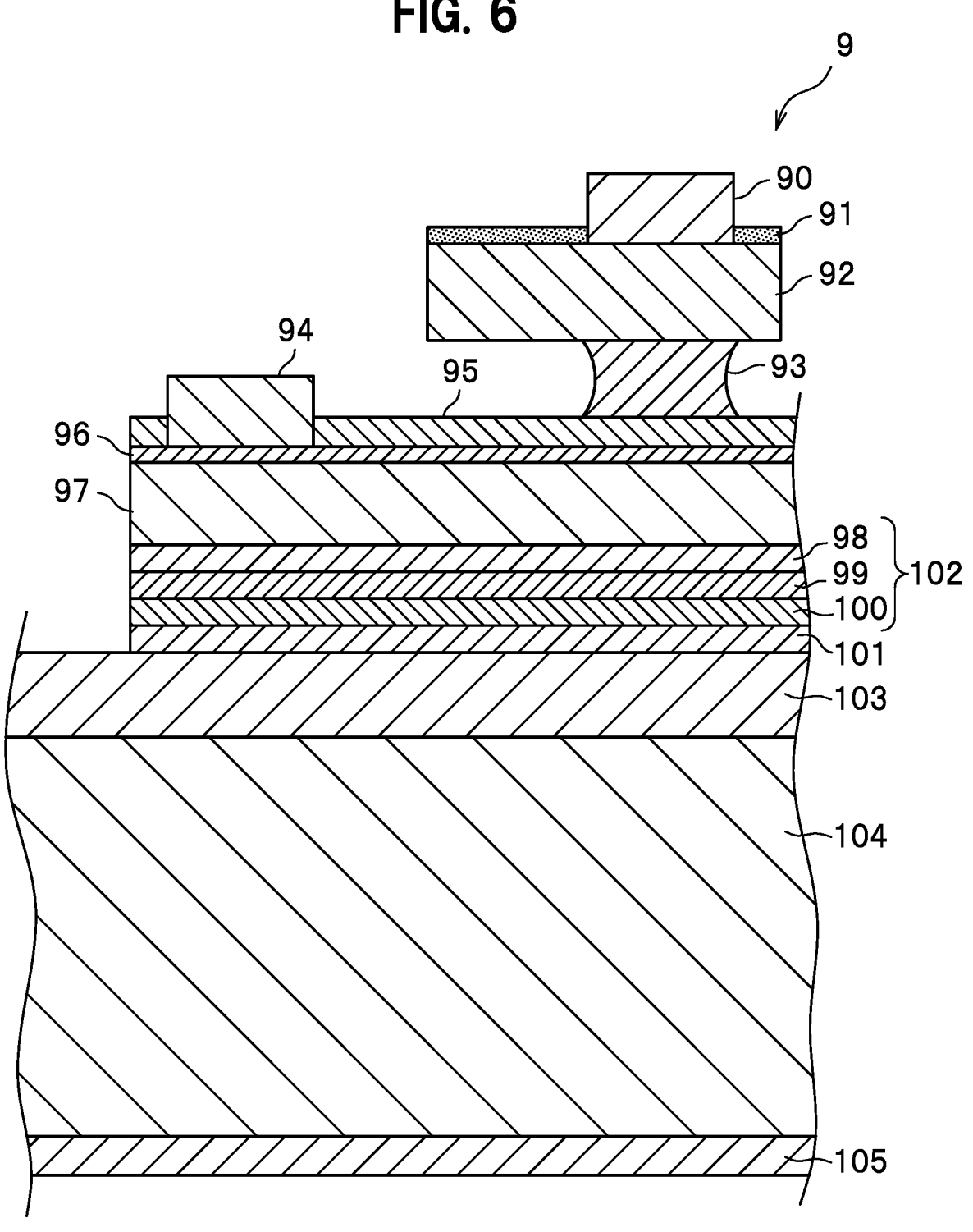
FIG. 6 is a cross-sectional view of a conventional VCSEL.

With reference to FIG. 5, description is given of differences in configuration between a variable-wavelength surface emission laser 1D according to a fourth embodiment and that of the first embodiment.

As shown in the upper part of FIG. 5, the variable-wavelength surface emission laser 1D is a variable-wavelength VCSEL that emits laser light upward.

As shown in FIG. 5, the variable-wavelength surface emission laser 1D includes an anode-side light emitting electrode 10D, an upper substrate 11D, a lower substrate 24D, and a lower movable electrode 25D, instead of the anode-side light emitting electrode 10, the upper substrate 11, the lower substrate 24, and the lower movable electrode 25 in FIG. 1.

Since the configuration other than the anode-side light emitting electrode 10D, the upper substrate 11D, the lower substrate 24D, and the lower movable electrode 25D is the same as that of the first embodiment, description thereof will be omitted.

The anode-side light emitting electrode 10D and the upper substrate 11D are not formed on the upper side of the light emitting region α so as not to interfere with the laser light. For example, the upper substrate 11D has an inverted trapezoidal exit hole β formed therein so that the plane of the DBR layer 12 located above the light emitting region α is exposed. The anode-side light emitting electrodes 10D are formed on either side of the exit hole β in the upper plane of the upper substrate 11D. Other than that, the anode-side light emitting electrode 10D and the upper substrate 11D are the same as those in the first embodiment, and thus further description thereof will be omitted.

The lower substrate 24D and the lower movable electrode 25D do not have the exit hole β formed in their centers, and have a flat plate shape. Other than that, the lower substrate 24D and the lower movable electrode 25D are the same as those in the first embodiment, and thus further description thereof will be omitted.

As described above, the variable-wavelength surface emission laser 1D can have the wavelength variation range widened as in the first embodiment even in the case of upward emission.

Modified Example

Although the respective embodiments of the present invention have been described in detail above, the present invention is not limited to the embodiments described above, and includes design changes and the like without departing from the scope of the invention.

In the respective embodiments, the description has been given of the example where the thin-plate substrate has a simple thin film structure, but the present invention is not limited thereto. For example, the thin-plate substrate may be supported by a meander-shaped spring so as to be movable more flexibly.

In the respective embodiments, the description has been given of the example using the n-type semiconductor, but the variable-wavelength surface emission laser according to the present invention can also be realized by using a p-type semiconductor.

The laminated structure of the variable-wavelength surface emission laser is not limited to the embodiments described above.

The shape of the upper movable electrode is not limited to the embodiments described above.

INDUSTRIAL APPLICABILITY

The present invention can be used as a semiconductor laser for various purposes. In particular, the present invention can be used for an atomic clock that requires stable performance and excellent wavelength controllability.

REFERENCE SIGNS LIST 1 to 1D variable-wavelength surface emission laser
10, 10D anode-side light emitting electrode (first light emitting electrode)
11, 11D upper substrate (first substrate)
12 DBR layer (first reflection layer)
13 active layer
13A optical confinement member
14 insulating layer
15 upper movable electrode (first movable electrode)
15A movable electrode main body part
15B movable electrode extension part
16 cathode-side light emitting electrode (second light emitting electrode)
16A light emitting electrode main body part
16B light emitting electrode extension part
17 air gap former
18 movable electrode terminal
19 light emitting electrode terminal
20, 20C movable mirror (second reflection layer)
21 reference potential terminal
22 thin-plate substrate
23 movable gap former
24, 24D lower substrate (second substrate)
25, 25D lower movable electrode (second movable electrode)
26 convex part
35 upper movable electrode (first movable electrode)
35A, $35A_1$ to $35A_3$ movable electrode main body part
35B, $35B_1$ to $35B_3$ movable electrode extension part

The invention claimed is:

1. A variable-wavelength surface emission laser comprising:
a first substrate;
a thin-plate substrate having a film thickness of substantially 1 micron, provided so as to face the first substrate via an air gap; and
a second substrate provided so as to face the thin-plate substrate via a movable gap,
wherein
the first substrate includes a first reflection layer formed on and being in direct contact with one plane of the first substrate, an active layer formed on and being in direct contact with the first reflection layer, an insulating layer formed on and being in direct contact with the active layer, and a first movable electrode formed on and being in direct contact with the insulating layer, the thin-plate substrate includes a second reflection layer formed on a plane facing the active layer,
the second substrate includes a second movable electrode formed on a plane opposite to the movable gap,
the thin-plate substrate and the second reflection layer have a partial region movable toward the air gap side and the movable gap side, the partial region being positioned between the air gap and the movable gap, wherein
the first movable electrode is configured to move the thin-plate substrate and the second reflection layer toward a side of the first substrate, and
the second movable electrode is configured to move the thin-plate substrate and the second reflection layer toward a side of the second substrate,
the first movable electrode is arranged around a light emitting region, and includes an arc-shaped movable electrode main body part having a space so as not to connect one end point to another end point, and a movable electrode extension part extended in a circumferential direction from the movable electrode main body part,
the first movable electrode includes a plurality of movable electrode main body parts formed concentrically around the light emitting region,
spaces between endpoints of the movable electrode main body parts, the spaces being extended from the plurality of movable electrode main body parts are located on the same axis extending in the circumferential direction from the light emitting region, and
a movable electrode extension part provided on the movable electrode main body part on the inner peripheral side is formed so as to straddle the movable electrode main body part on the outer peripheral side via an insulating film.

2. The variable-wavelength surface emission laser according to claim 1, further comprising:
a first light emitting electrode formed on another plane of the first substrate, and
a second light emitting electrode formed on the same plane as the first movable electrode on the active layer, wherein
the second light emitting electrode includes
a light emitting electrode main body part formed between the movable electrode main body part located on the innermost peripheral side and the light emitting region, and
a light emitting electrode extension part extended in the circumferential direction from the light emitting electrode main body part so as to pass through spaces extended from the plurality of movable electrode main body parts.

3. The variable-wavelength surface emission laser according to claim 1, wherein
the second reflection layer has a convex part formed on its plane on the side where the air gap is located.

4. The variable-wavelength surface emission laser according to claim 1, further comprising:
an air gap former that forms the air gap between the active layer and the second reflection layer; and
a movable gap former that forms the movable gap between the thin-plate substrate and the second substrate.

* * * * *